(12) United States Patent
Bauhahn et al.

(10) Patent No.: US 7,335,871 B2
(45) Date of Patent: Feb. 26, 2008

(54) LOW POWER SWITCHING FOR ANTENNA RECONFIGURATION

(75) Inventors: Paul E. Bauhahn, Fridley, MN (US); Robert C. Becker, Eden Prairie, MN (US); David W. Meyers, Brooklyn Park, MN (US); Kelly P. Muldoon, Minneapolis, MN (US)

(73) Assignee: Honeywell International Inc., Morristown, NJ (US)

( * ) Notice: Subject to any disclaimer, the term of this patent is extended or adjusted under 35 U.S.C. 154(b) by 54 days.

(21) Appl. No.: 11/253,188

(22) Filed: Oct. 18, 2005

(65) Prior Publication Data

US 2007/0084987 A1    Apr. 19, 2007

(51) Int. Cl.
*G01J 1/42*    (2006.01)
*H03K 17/78*    (2006.01)

(52) U.S. Cl. ............................. 250/208.4; 250/214 R; 250/214 SW; 327/515

(58) Field of Classification Search ............ 250/208.4, 250/214 LS, 214 SW; 327/515
See application file for complete search history.

(56) References Cited

U.S. PATENT DOCUMENTS

| | | | | |
|---|---|---|---|---|
| 3,321,631 A | * | 5/1967 | Biard et al. ............... | 250/208.3 |
| 5,693,952 A | * | 12/1997 | Cox .......................... | 250/551 |
| 6,469,677 B1 | * | 10/2002 | Schaffner et al. ........... | 343/876 |
| 6,670,597 B1 | * | 12/2003 | Kitamura et al. ..... | 250/214 AL |
| 6,985,109 B2 | * | 1/2006 | Lust et al. ........... | 343/700 MS |
| 2006/0066252 A1 | * | 3/2006 | Kim ........................ | 315/169.3 |

OTHER PUBLICATIONS

C.K. Sun et al. "Photovoltaic-FET for Optoelectronic RF/microwave Switching". Oct. 1996. IEEE Transactions on Microwave Theory and Techniques, vol. 44, No. 10, pp. 1747-1750.*

* cited by examiner

*Primary Examiner*—Georgia Epps
*Assistant Examiner*—Christopher M Yealy
(74) *Attorney, Agent, or Firm*—McDonnell, Boehnen, Hulbert, and Berghoff LLP (57) ABSTRACT

Methods and systems for low power switching are provided. In one embodiment, an optical switching system is provided. The system comprises at least one optically controlled switch adapted to maintain one of an open state and a closed state based on an associated light signal; and at least one light source adapted to output the associated light signal to the at least one switch, wherein the at least one light source cycles the light signal on and off, wherein the at least one light source is cycled on for a sufficient duration of time and with a sufficient periodicity to maintain the optically controlled switch in one of an open state and a closed state.

22 Claims, 6 Drawing Sheets

LOW POWER SWITCHING FOR ANTENNA RECONFIGURATION

GOVERNMENT LICENSE RIGHTS

The U.S. Government may have certain rights in the present invention as provided for by the terms of Government Contract # R-700-200451-20053/NASA: NNC04AA44A awarded by the Ohio Aerospace Institute/ NASA GLENN.

TECHNICAL FIELD

The present invention generally relates to radio frequency antennas and more particularly to switching reconfigurable antennas.

BACKGROUND

Passive antennas cannot be steered or reconfigured. Electrically reconfigurable and steerable antennas technology is currently under development. One means currently used to reconfigure steerable antennas is optically coupled switches. To maintain steady-state antenna configurations, each optically coupled switch must be held in its present state. The problem with current optically coupled switch systems and methods is that to hold a switch in its present state, a number of optical light sources must remain on for the duration of the steady-state antenna configuration. For example, a full antenna element array may include 800 optically controlled switches. Each switch might be controlled by a typical VCSEL light source that draws up to 45 mW to maintain a single optical switch in an off-state. For an antenna configuration requiring 400 elements the total power consumption required to maintain the remaining 400 elements in an off-state would be 18 watts. This level of power consumption is excessive for many applications with limited power resources, or where heat accumulation is of concern. For the reasons stated above and for other reasons stated below which will become apparent to those skilled in the art upon reading and understanding the specification, there is a need in the art for low power switching and configuration state techniques for a reconfigurable antenna.

SUMMARY

The Embodiments of the present invention provide methods and systems for Low Power Switching for Antenna Reconfiguration and will be understood by reading and studying the following specification.

In one embodiment, a method for antenna reconfiguration switching is provided. The method comprises directing a light signal at an optically controlled switch, wherein the optically controlled switch is adapted to open and close a current path between two pad elements of a reconfigurable antenna based on the light signal; and cycling the light signal on and off, wherein the light signal is cycled on for a sufficient duration of time and with a sufficient periodicity to maintain the optically controlled switch in one of an open state and a closed state.

In another embodiment, a reconfigurable antenna system is provided. The system comprises a plurality of pad elements arranged in an array, wherein at least one pad element of the plurality of pad elements is adapted to be driven by an electrical signal; a plurality of switches, wherein each switch of the plurality of switches is adapted to switch together two or more pad elements of the plurality of pad elements; and a plurality of light sources, wherein each switch is maintained in one of an open state and a closed state based on a light signal output from an associated light source, wherein the light source cycles the light signal output on and off based on a duty cycle.

In yet another embodiment, an optical switching system is provided. The system comprises at least one optically controlled switch adapted to maintain one of an open state and a closed state based on an associated light signal; and at least one light source adapted to output the associated light signal to the at least one switch, wherein the at least one light source cycles the light signal on and off, wherein the at least one light source is cycled on for a sufficient duration of time and with a sufficient periodicity to maintain the optically controlled switch in one of an open state and a closed state.

In still another embodiment, a system for switching is provided. The system comprises means for controlling current flow based on a switching voltage; means for generating a light signal, wherein the means for generating the light signal is adapted to cycle the light signal on and off; means for receiving a light signal responsive to the means for generating a light signal, wherein the means for receiving a light signal is coupled to the means for controlling current flow, wherein the means for receiving a light signal is adapted to produce the switching voltage when the light signal is received; and means for maintaining the switching voltage above a minimum voltage when the light signal is cycled off, wherein the means for maintaining the switching voltage is responsive to the means for receiving a light signal; wherein the light signal is cycled on for a sufficient duration of time and with a sufficient periodicity to maintain the means for a controlling current flow in one of an open state and a closed state.

DRAWINGS

Embodiments of the present invention can be more easily understood and further advantages and uses thereof more readily apparent, when considered in view of the description of the preferred embodiments and the following figures in which.

In accordance with common practice, the various described features are not drawn to scale but are drawn to emphasize features relevant to the present invention. Reference characters denote like elements throughout figures and text.

DETAILED DESCRIPTION

In the following detailed description, reference is made to the accompanying drawings that form a part hereof, and in which is shown by way of illustration specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the scope of the present invention. The following detailed description is, therefore, not to be taken in a limiting sense.

Embodiments of the present invention greatly reduce the power required to hold antenna configurations by duty-cycling the optical driver at a minimum duty cycle and frequency in order to maintain the switch state and the resulting antenna configuration.

Figure 1A:
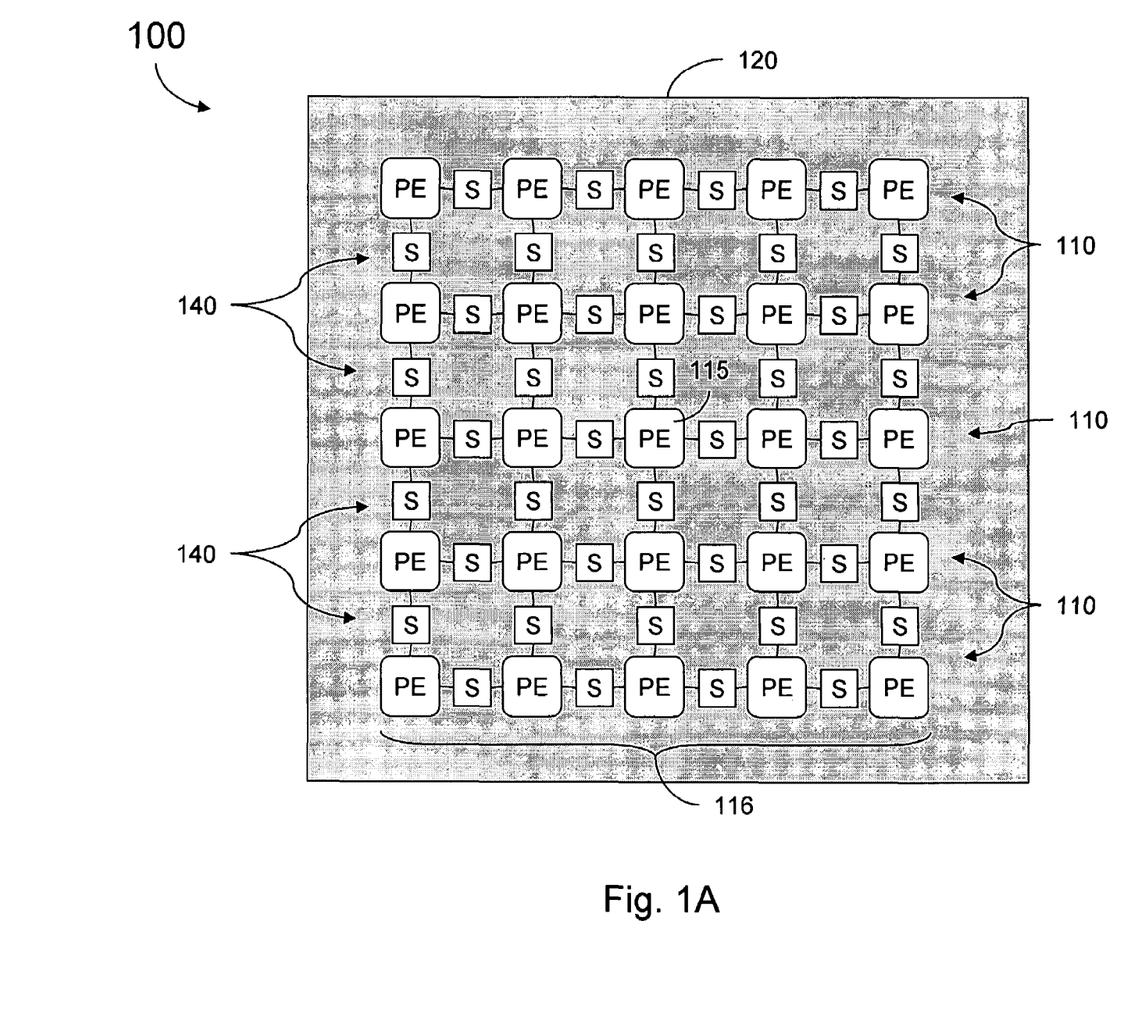
FIGS. 1A and 1B are diagrams illustrating a reconfigurable antenna aperture of one embodiment of the present invention.
Figure 1B:
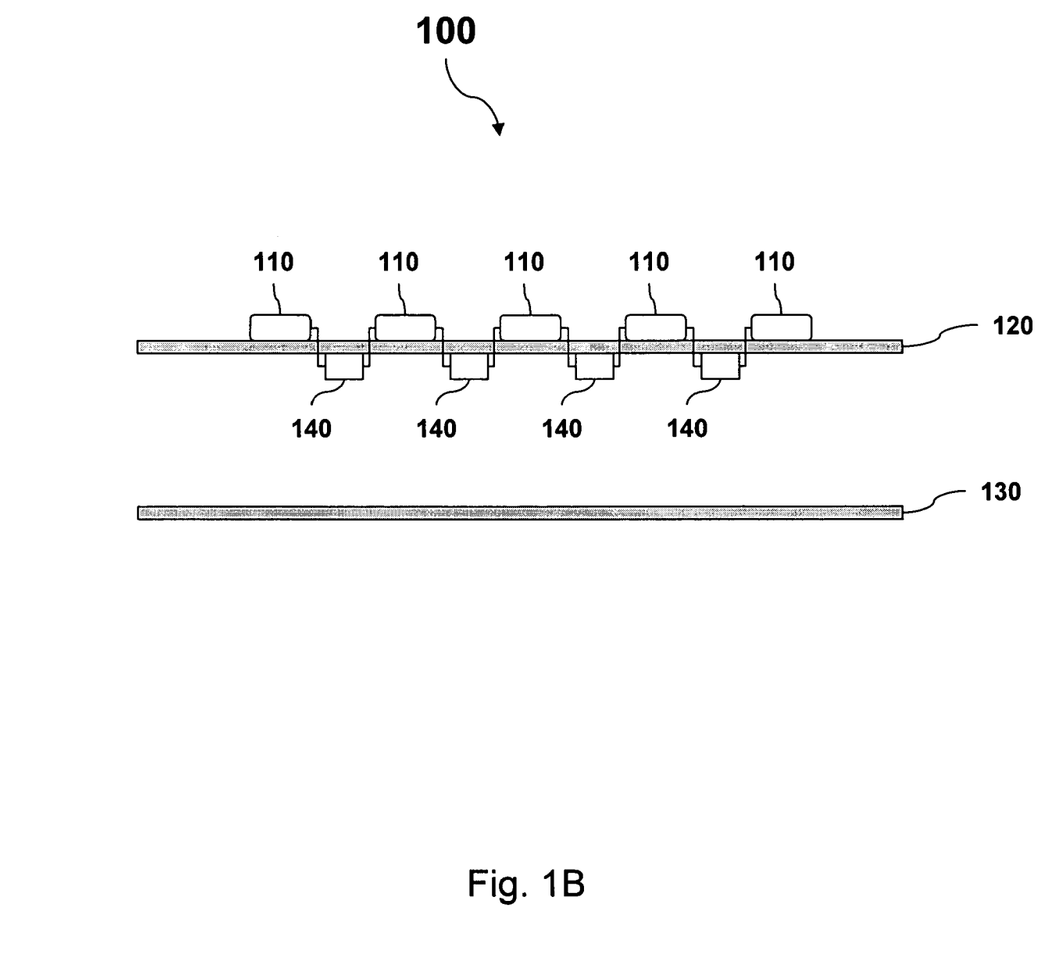

FIG. 1A illustrates reconfigurable antenna aperture 100 of one embodiment of the present invention. Aperture 100 comprises a matrix of metallic pad elements (PEs) 110 arranged in an array 116. In one embodiment, pad elements 110 are mounted onto a printed circuit board 120. The printed circuit board 120 is suspended over a ground plane 130 to form an antenna, as illustrated in FIG. 1B. Aperture 100 further comprises a plurality of switches (S) 140 which function to couple or decouple neighboring pad elements 110 together.

In operation, in one embodiment, one of the pad elements 110, such as center element 115, is driven by an electrical signal. By opening and closing one or more of switches 140 the pattern in which current flows from center element 115 through pad elements 110 of aperture 100 can be reconfigured, enabling the ability to reconfigure the resulting radiation pattern from aperture 100. The pattern of current flow can thusly be reconfigured to create antenna array patterns, such as but not limited to a bent wire pattern and a spiral pattern, each with known radiation patterns.

Figure 2:
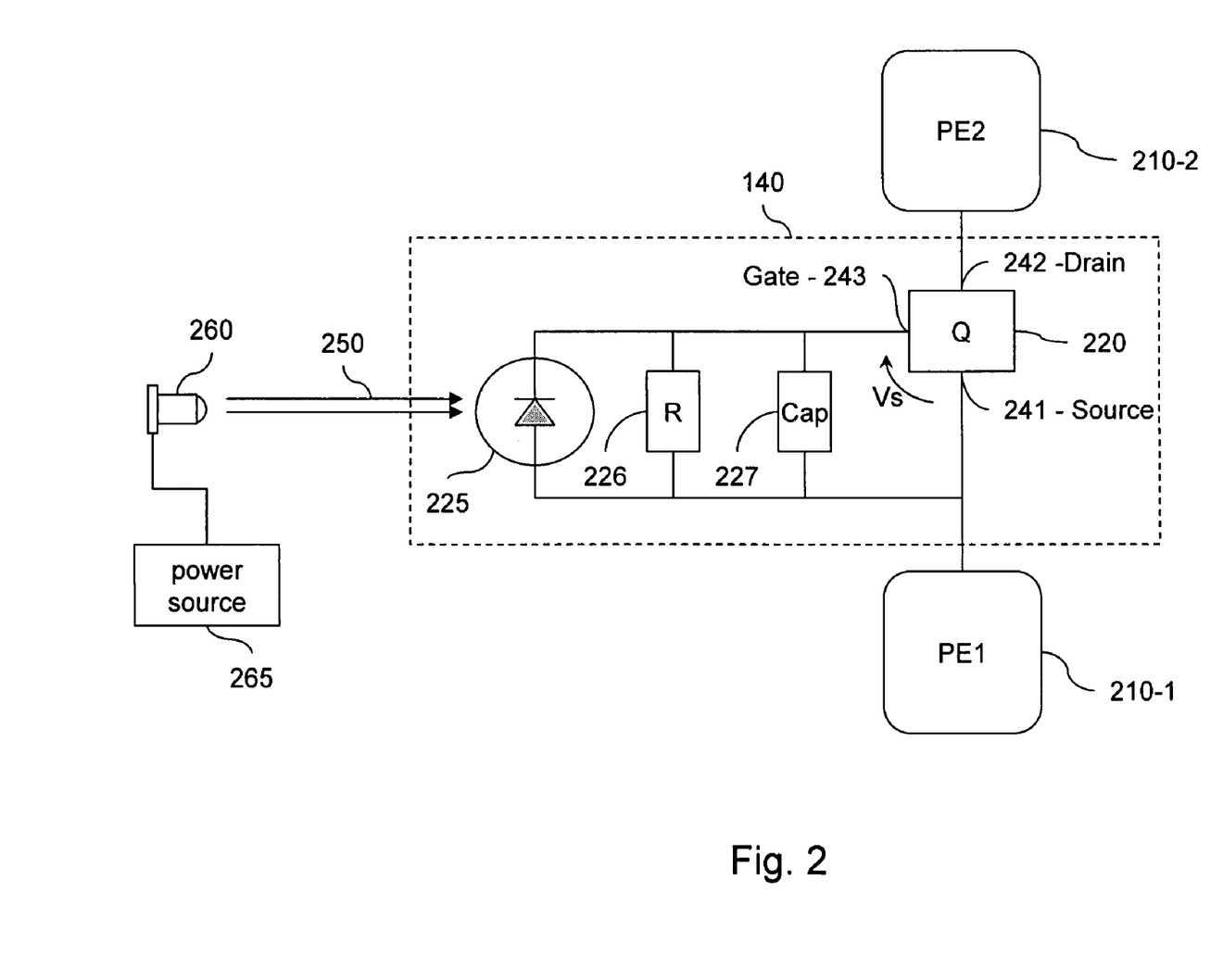
FIG. 2 is a diagram of an optical switch of one embodiment of the present invention.

As illustrated in FIG. 2, switches 140 are optically driven switches. One advantage of optically driven switches is that they avoid the need for additional control wires located near pad elements 110, which would tend to distort the radiation pattern of aperture 100. In one embodiment, each of switches 140 comprise a switching device (Q) 220 coupled between a first pad element (PE1) 210-1 and a second pad element (PE2) 210-2. In one embodiment, switching device 220 is a transistor, such as a field effect transistor (FET) having a source 241, a drain 242 and a gate 243. In one embodiment, first pad element 210-1 and second pad element 210-2 are coupled to source 241 and drain 242, respectively. In one embodiment, switches 140 further comprise at least one photodiode 225 coupled to gate 243 of switching device 220. In one embodiment, photodiode 225 comprises one or more photodiodes connected in series.

In operation, switching device 220 couples and decouples first pad element 210-1 and second pad element 210-2 in response to a light signal 250 produced by light source 260. In one embodiment, switching device 220 is a depletion mode device requiring the application of a negative voltage across gate 243 and source 241 to decrease current flow from source 241 to drain 242 (i.e. to open the switch). In one embodiment, switching device 220 is an enhancement mode device that is normally off when there is no voltage across gate 243 and source 241 and allows current flow upon application of a sufficient positive voltage across gate 243 and source 241.

In one embodiment, when photodiode 225 receives light signal 250 from light source 260, a switching voltage Vs is produced across gate 243 and source 241 sufficient to prevent current flow from first pad element 210-1 to second pad element 210-2. The minimum voltage (Vmin) sufficient to shut off switch device 220 is a function of the particular transistor used to realize switch device 220, and can be readily ascertained by one skilled in the art upon reading this specification. When light source 260 turns off light signal 250, Vs collapses below Vmin, allowing current to flow from first pad element 210-1 to second pad element 210-2. In one embodiment, a discharge resistor 226 is connected in parallel with photodiode 225 to discharge residual voltage once light signal 250 has been removed.

In one embodiment, light source 260 is one of, but not limited to, a light emitting diode, a laser light, and a vertical cavity surface emitting laser (VCSEL), or similar light source adapted to generate a light beam sufficiently focused to illuminate a photodiode 225 of one switch 140 without interfering with the operation of a neighboring switch 140 on aperture 100.

Embodiments of the present invention take advantage of capacitances within switch 140 to maintain Vs above Vmin without the need to continuously maintain light signal 250 from light source 260 by duty cycling light signal 250 with a sufficient "on" duration and frequency.

Figure 3:
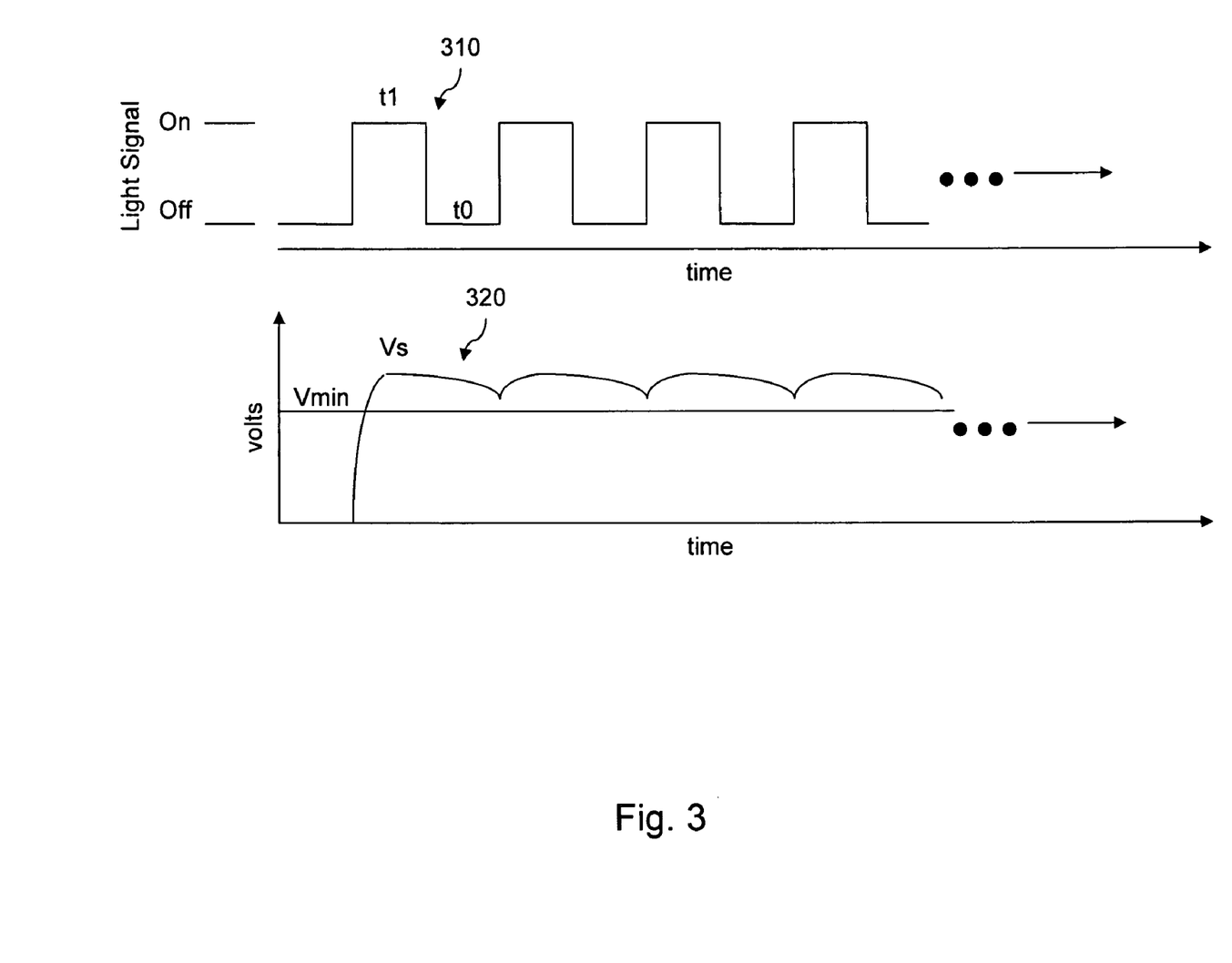
FIG. 3 is a diagram illustrating the relationship between a duty cycled light signal and a switching voltage of one embodiment of the present invention.

FIG. 3 illustrates the relationship between light signal 250 and the voltage Vs over time. The gate 243 to drain 242 junction of switching device 220 has a very high impedance and therefore draws little current.

When light signal 250 is removed (shown at 310), Vs does not immediately collapse to zero but is supported (shown at 320) by the intrinsic capacitances possessed by one or both of switching device 220 and photodiode 225. These capacitances store energy which will continue to support Vs after light signal 250 is removed. The rate of collapse for Vs is a function of those capacitances and the resistance of discharge resistor 226. To maintain Vs above Vmin, embodiments of the present invention cycle light signal 250 on and off. Light signal 250 is cycled on for a sufficient duration (t1) and with sufficient periodicity (t1+t0) to generate a Vs greater than Vmin such that Vs does not discharge below Vmin during the part of the cycle that light signal 250 is off (t0). In one embodiment, a capacitor (Cap) 227 may be optionally coupled across gate 243 and source 241 to increase the time constant that controls the decay time of Vs.

The electric power consumption required by light source 260 to generate light signal 250 is a function of the ratio of the duration light signal 250 is on (t1) to the sum of time light signal 250 is off (t0) and on (t1). For example, in one embodiment, where light source 260 is a VCSEL, when t1 is equal to ⅓ of the total cycle period (i.e., t1+t0), the power consumed by light source 260 will be only ⅓ of that consumed when light source 260 is continuously on. As would be appreciated by one skilled in the art upon reading this specification, the ratio of t1 to t0 and the total cycle period t1+t0 for a particular application can be readily determined based on the capacitances of photodiode 225, switching device 220, capacitor 227 and the resistance of resistor 226. In choosing values for capacitor 227 and resistor 226, one skilled in the art upon reading this specification would also appreciate the tradeoff between the decay time of Vs and the speed at which aperture 100 can be reconfigured. When fast switching is required for fast reconfiguration of aperture 100, Vs must decay quickly. In one embodiment, when a shorter Vs decay time is required, a small capacitance value is chosen for capacitor 227. In one embodiment, to decrease Vs decay time, capacitor 227 is omitted. In that case, embodiments of the present invention rely on the intrinsic capacitance of one or more of photodiode 225 and switching device 220. When fast switching is not required for reconfiguration of aperture 100, then the decay time of Vs can be longer and a larger capacitance value chosen for capacitor 227. The capacitance of capacitor 227 and the values for t1 and t0 can thus be readily determined by one skilled in the art upon reading this specification.

Figure 4:
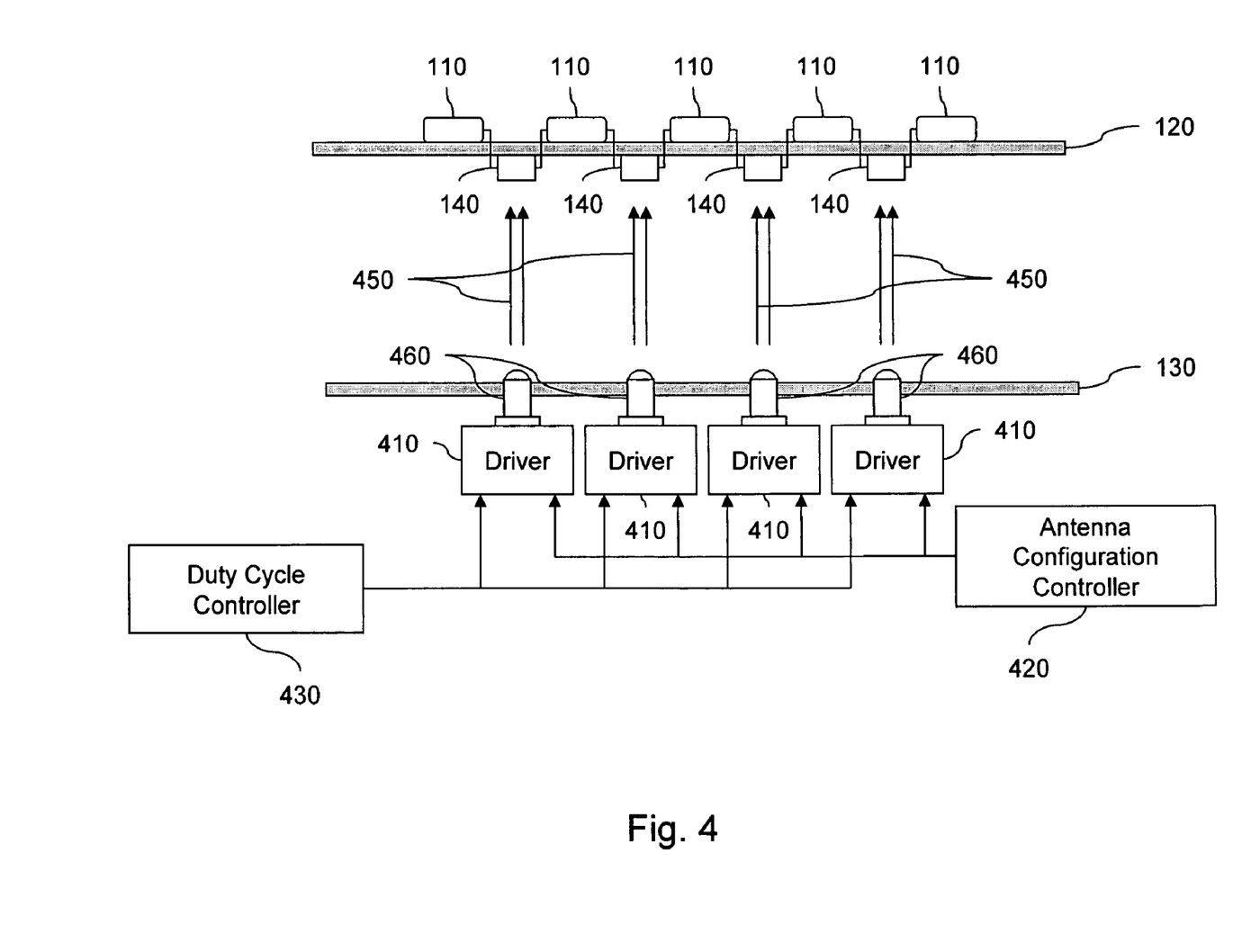
FIG. 4 is a diagram illustrating a reconfigurable antenna aperture of one embodiment of the present invention.

Several means are available to create a light signal 250 having a duty cycle as described with respect to FIG. 3. For example, in one embodiment the power source 265 for light source 260 is cycled to satisfy t1 and t0. As illustrated in FIG. 4, in another embodiment, an aperture 100 further comprises a plurality of light sources 460 each controlled by an associated driver 410. In one embodiment, light sources 460 are each VCSELs such as, but not limited to the VCE-F85B20 manufactured by Lasermate Group, Inc. In one embodiment, light sources 460 are embedded into ground plane 130 and positioned to illuminate exactly one of switches 140. In one embodiment, each driver 410 controls one or more of light sources 460. In one embodiment drivers 410 are drivers such as, but not limited to the STP16CL596 manufactured by STMicroelectronics. In one embodiment, an antenna configuration controller 420 is coupled to communicate the desired antenna array pattern to drivers 410. In one embodiment, antenna configuration controller 420 is a TMS320c6711 digital microprocessor manufactured by Texas Instruments. In one embodiment, based on the communicated antenna array pattern, each driver will turn off one or more of switches 140 by turning on one or more of light sources 460. In one embodiment, a duty cycle controller 430 is also coupled to drivers 410 to communicate a duty cycle signal to each of drivers 410 for cycling light sources 460. For example, in one embodiment, duty cycle controller 430 is coupled to an output enable pin of an STP16CL596. In one embodiment, for each switch 140 which should be in an off state based on the antenna array pattern communicated from antenna configuration controller 420, drivers 410 will cycle the associated light sources 460 on (for time t1) and off (for time t0) as directed by duty cycle controller 430. In one embodiment, duty cycle controller 430 outputs a duty cycle signal comprising a square wave signal with a signal low for time t1 and a signal high for time t0. By duty cycling light signals 450 from light sources 460 based on t1 and t0, Vs within each of the switches 140 that need to remain off in order to establish the desired antenna array pattern will be maintained above Vmin.

Figure 5:
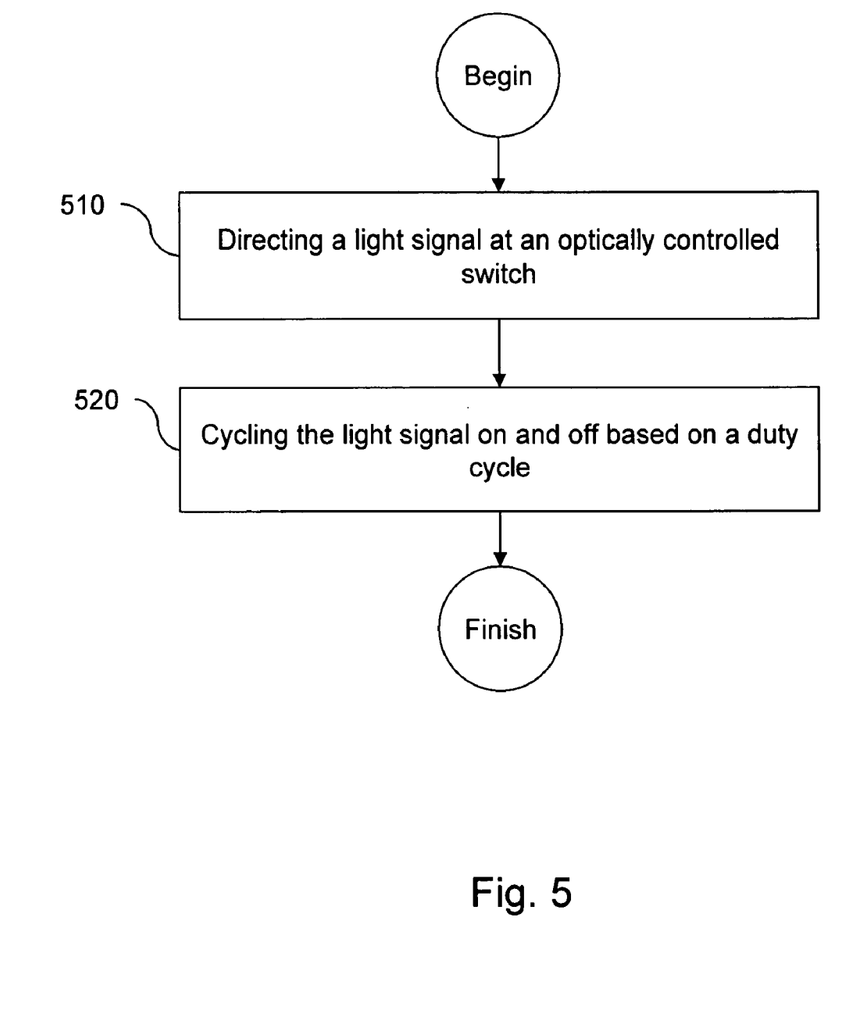
FIG. 5 is a flow chart illustrating a method of one embodiment of the present invention.

FIG. 5 is a flow diagram illustrating a method for antenna reconfiguration switching of one embodiment of the present invention. The method begins at 510 with directing a light signal at an optically controlled switch. In one embodiment, the optically controlled switch is switch 140 as illustrated in FIGS. 1 and 2. In one embodiment, the optically controlled switch is adapted to control the flow of current between two pad elements based on the light signal. The method then proceeds to 520 with cycling the light signal on and off. As described with respect to FIGS. 2 and 3, the light signal must cycle on for a sufficient duration to generate a switching voltage, Vs, that is greater than a minimum voltage, Vmin, required to operate a switching device (such as switching device 220). In one embodiment, where the switching device is a depletion device, which requires negative control voltages to open the switch, Vs must be more negative than Vmin to open the switching device and stop current flow between the two pad elements. When Vs is less negative than Vmin, then the switching device closes, allowing current flow between the two pad elements. As described above, in one embodiment, the light signal must be cycled on for a sufficient duration of time and with a sufficient periodicity to maintain the switching device in the open state.

In one embodiment, when the light signal is on and received by one or more photodiodes of the optically controlled switch, the method further comprises generating a switching voltage, Vs, from the light signal and applying the switching voltage across a gate-source junction of a transistor. While the photodiode is producing the switching voltage, electrical energy from the voltage is stored by one or more intrinsic capacitances of the photodiode and switching device, and in one embodiment, by one or more capacitors. When the light signal is cycled off, the stored electrical energy maintains Vs above Vmin for a limited duration of time. The light signal is then cycled on again before Vs can decay below Vmin. In one embodiment the duration and periodicity for cycling the light signal on and off is based on a duty cycle signal which is communicated to a driver that controls the light signal. The driver cycles the light signal on and off based on the duty cycle signal. Additionally, because not every optically controlled switch will need to be operated to establish the desired antenna array pattern, the antenna array pattern is also communicated to the driver that control the light signal. In one embodiment, only light signals specified by the antenna array pattern are cycled on and off based on the duty cycle. Embodiments of the present invention thus reduce the amount of power consumption required to maintain an antenna aperture in a given antenna array pattern because the duty cycling of the light signals reduces the electric power consumption required by light source that generate the light signals.

Although embodiments of the present invention illustrated in this specification demonstrate maintaining optically controlled switches in an open state by duty cycling a light source, embodiments of the present invention are not limited to only maintaining optically controlled switches in an open state. To the contrary, one skilled in the art would appreciate that the scope of the present invention equally includes embodiments where light signals maintain optically controlled switches in a closed state. In addition, although this specification demonstrates duty cycling optical signals for optical switches in antenna application, the scope of embodiments of the present invention also include any optical switching system for coupling together other devices by maintaining an optically generated switching voltage at a level greater than a minimum voltage by duty cycling a light source.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A method for antenna reconfiguration switching, the method comprising:
   directing a light signal at an optically controlled switch, wherein the optically controlled switch is adapted to open and close a current path between two pad elements of a reconfigurable antenna based on the light signal; and
   cycling the light signal on and off based on a duty cycle, wherein the light signal is cycled on for a sufficient duration of time and with a sufficient periodicity to maintain the optically controlled switch in one of an open state and a closed state.

2. The method of claim 1, further comprising:
   receiving the light signal;
   when the light signal is on, generating a switching voltage from the light signal;
   applying the switching voltage across a gate terminal and a source terminal of a transistor;

capacitively storing electrical energy from the switching voltage; and when the light signal is off, maintaining the switching voltage above a minimum voltage for a duration of time by discharging the stored electrical energy.

3. The method of claim 1, further comprising:

communicating a duty cycle signal to a driver adapted to control the light signal; and controlling the light signal based on the duty cycle signal.

4. The method of claim 3, further comprising:

communicating an antenna array pattern to the driver adapted to control the light signal; and controlling the light signal based on both the antenna array pattern and the duty cycle signal.

5. A reconfigurable antenna system, the system comprising:

a plurality of pad elements arranged in an array, wherein at least one pad element of the plurality of pad elements is adapted to be driven by an electrical signal;

a plurality of switches, wherein each switch of the plurality of switches is adapted to switch together two or more pad elements of the plurality of pad elements; and a plurality of light sources, wherein each switch is maintained in one of an open state and a closed state based on a light signal output from an associated light source, wherein the light source cycles the light signal output on and off based on a duty cycle.

6. The system of claim 5, wherein the plurality of switches each comprise:

a switching device having a source terminal, a drain terminal and a gate terminal, wherein the source terminal is coupled to a first pad element of the plurality of pad elements and the drain terminal is coupled to a second pad element of the plurality of pad elements; and one or more photodiodes coupled across the gate terminal and the source terminal and adapted to produce a voltage across a gate-source junction of the switching device when a light signal is received from the associated light source of the plurality of light sources.

7. The system of claim 6, the plurality of switches each further comprising one or both of one or more discharge resistors coupled across the gate terminal and the source terminal and one or more capacitors coupled across the gate terminal and the source terminal.

8. The system of claim 5, wherein the duty cycle comprises a first duration and a second duration, wherein each of the plurality of light sources are adapted to cycle the light signal output on for a period of time equal to the first duration and cycle the light signal output off for a period of time equal to the second duration.

9. The system of claim 8, wherein the first duration and second duration are adapted to maintain a switching voltage above a minimum voltage by discharging a capacitively stored electrical energy.

10. The system of claim 5, wherein the plurality of light sources each comprise one or more of a light emitting diode, a laser light device, and a vertical cavity surface emitting laser.

11. The system of claim 5, further comprising:

a plurality of drivers, wherein each driver is adapted to control the light signal output of one or more of the plurality of light sources;

an antenna configuration controller adapted to communicate an antenna array pattern to the plurality of drivers, wherein the plurality of drivers control the light signal output of the plurality of light sources based on the antenna array pattern; and a duty cycle controller coupled to the plurality of drivers, wherein the duty cycle controller outputs a duty cycle signal to each of the plurality of drivers, wherein each driver is adapted to cycle the light signal output of the one or more of the plurality of light sources on and off based on the duty cycle signal.

12. The system of claim 5, further comprising:

a ground plane, wherein the plurality of light sources are embedded within the ground plane.

13. An optical switching system, the system comprising:

at least one optically controlled switch adapted to maintain one of an open state and a closed state based on an associated light signal; and at least one light source adapted to output the associated light signal to the at least one switch, wherein the at least one light source cycles the light signal on and off based on a duty cycle, wherein the at least one light source is cycled on for a sufficient duration of time and with a sufficient periodicity to maintain the optically controlled switch in one of an open state and a closed state.

14. The system of claim 13, wherein the at least one switch comprises:

a switching device having a source terminal, a drain terminal and a gate terminal, wherein the source terminal is coupled to a first device and the drain terminal is coupled to a second device; and one or more photodiodes coupled across the gate terminal and the source terminal and adapted to produce a voltage across a gate-source junction of the switching device when the associated light signal is received from the at least one light source.

15. The system of claim 14, the at least one switch comprising one or both of one or more discharge resistors coupled across the gate terminal and the source terminal and one or more capacitors coupled across the gate terminal and the source terminal.

16. The system of claim 14, wherein the first device is a first pad element of a plurality of pad elements of a reconfigurable antenna aperture and second device is a second pad element of the plurality of pad elements of the reconfigurable antenna aperture.

17. The system of claim 13, wherein the duty cycle comprises a first duration and a second duration, wherein the at least one light source is adapted to cycle the light signal output on for a period of time equal to the first duration and cycle the light signal output off for a period of time equal to the second duration.

18. The system of claim 17, wherein the first duration and second duration are adapted to maintain a switching voltage above a minimum voltage by discharging a capacitively stored electrical energy.

19. The system of claim 13, wherein the at least one light source comprises one or more of a light emitting diode, a laser device, and a vertical cavity surface emitting laser.

20. A system for switching, the system comprising:

means for controlling current flow based on a switching voltage;

means for generating a light signal, wherein the means for generating the light signal is adapted to cycle the light signal on and off based on a duty cycle;

means for receiving a light signal responsive to the means for generating a light signal, wherein the means for receiving a light signal is coupled to the means for controlling current flow, wherein the means for receiving a light signal is adapted to produce the switching voltage when the light signal is received; and means for maintaining the switching voltage above a minimum voltage when the light signal is cycled off, wherein the means for maintaining the switching voltage is responsive to the means for receiving a light signal;

wherein the light signal is cycled on for a sufficient duration of time and with a sufficient periodicity to maintain the means for a controlling current flow in one of an open state and a closed state.

21. The system of claim 20, further comprising:

means for communicating a duty cycle signal to the means for generating a light signal, wherein the means for generating a light signal cycles the light signal on and off based on the duty cycle signal.

22. The system of claim 20, further comprising:

means for storing electrical energy coupled to the means for receiving a light signal, wherein the means for storing electrical energy stores energy based on the switching voltage when the light signal is received, and wherein the means for storing electrical energy maintains the switching voltage above a minimum voltage for a duration of time by discharging stored electrical energy when the light signal is not received.

* * * * *